United States Patent
Chang et al.

(10) Patent No.: US 10,720,106 B2
(45) Date of Patent: Jul. 21, 2020

(54) DRIVING APPARATUS FOR DRIVING DISPLAY PANEL

(71) Applicant: Novatek Microelectronics Corp., Hsinchu (TW)

(72) Inventors: Hua-Gang Chang, Hsinchu County (TW); Shang-I Liu, Kaohsiung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/198,687

(22) Filed: Nov. 21, 2018

(65) Prior Publication Data
US 2019/0156757 A1    May 23, 2019

Related U.S. Application Data

(60) Provisional application No. 62/588,939, filed on Nov. 21, 2017.

(51) Int. Cl.
*G09G 3/3258* (2016.01)
*H01L 27/32* (2006.01)
(Continued)

(52) U.S. Cl.
CPC ............. *G09G 3/3258* (2013.01); *G09G 3/32* (2013.01); *H01L 27/156* (2013.01);
(Continued)

(58) Field of Classification Search
CPC .. G09G 3/3258; G09G 3/32; G09G 2320/045; G09G 2330/12;
(Continued)

(56) References Cited

U.S. PATENT DOCUMENTS 9,697,769 B2    7/2017    Kishi et al.
9,953,563 B2    4/2018    Kishi et al.
(Continued)

FOREIGN PATENT DOCUMENTS

CN    101393720    3/2009
CN    105144274    12/2015
(Continued)

OTHER PUBLICATIONS

"Office Action of Taiwan Counterpart Application," dated Jun. 25, 2019, p. 1-p. 4.
(Continued)

*Primary Examiner* — Abhishek Sarma
(74) *Attorney, Agent, or Firm* — JCIPRNET

(57) ABSTRACT

A driving apparatus for driving a display panel including a connection pad, a selecting circuit, a data driving circuit and a detection circuit is provided. The selecting circuit is electrically connected to a data line of the display panel through the connection pad. The data driving circuit outputs a data voltage to a pixel circuit of the display panel through the selecting circuit and the connection pad in a display stage. The detection circuit provides a detection signal to a light-emitting element of the pixel circuit through the selecting circuit and the connection pad in a detection stage, and detects a resultant signal with respect to an electric characteristic of the light-emitting element of the pixel circuit in the detection stage.

16 Claims, 9 Drawing Sheets

(51) Int. Cl.
*G09G 3/32* (2016.01)
*H01L 27/15* (2006.01)
*G09G 3/00* (2006.01)

(52) U.S. Cl.
CPC ......... *H01L 27/3276* (2013.01); *G09G 3/006* (2013.01); *G09G 2310/0243* (2013.01); *G09G 2310/0297* (2013.01); *G09G 2320/0295* (2013.01); *G09G 2320/045* (2013.01); *G09G 2330/12* (2013.01)

(58) Field of Classification Search
CPC ........... G09G 2320/0295; G09G 3/006; G09G 2310/0297; G09G 2310/0243; H01L 27/156; H01L 27/3276
See application file for complete search history.

(56) References Cited

U.S. PATENT DOCUMENTS

| | | | |
|---|---|---|---|
| 2007/0024544 A1* | 2/2007 | Chung | G09G 3/3233 345/76 |
| 2009/0073094 A1 | 3/2009 | Akimoto et al. | |
| 2009/0184896 A1* | 7/2009 | Kwon | G09G 3/3233 345/76 |
| 2016/0055791 A1 | 2/2016 | Kishi et al. | |
| 2016/0104422 A1 | 4/2016 | Kishi et al. | |

FOREIGN PATENT DOCUMENTS

| | | |
|---|---|---|
| CN | 105339998 | 2/2016 |
| CN | 105702213 | 6/2016 |
| TW | 200921602 | 5/2009 |

OTHER PUBLICATIONS

"Office Action of China Counterpart Application", dated Mar. 5, 2020, p. 1-p. 6.

* cited by examiner

DRIVING APPARATUS FOR DRIVING DISPLAY PANEL

CROSS-REFERENCE TO RELATED APPLICATION

This application claims the priority benefit of U.S. provisional application Ser. No. 62/588,939, filed on Nov. 21, 2017. The entirety of the above-mentioned patent application is hereby incorporated by reference herein and made a part of this specification.

FIELD OF THE INVENTION

The invention relates a driving apparatus for driving a display panel, and more particularly, relates to a driving apparatus capable of detecting a configuration condition of a light-emitting element in a display panel.

DESCRIPTION OF RELATED ART

Light-emitting display panels are widely used in various types of display apparatuses, such as mobile phones, tablet computers, and the like. The light-emitting display panels include, for example, an organic light-emitting diode (OLED) display panel, a micro light-emitting diode (µLED) display panel, etc. A display panel has a plurality of pixel circuits formed in an array, in which each of the pixel circuits includes one light-emitting element. In the OLED display panel, the light-emitting element is an organic light-emitting diode (OLED). In the µLED display panel, the light-emitting element is a micro light-emitting diode (µLED).

In the manufacturing process of the µLED display panel, a µLED array is first formed on a source substrate (e.g., a wafer), and then the µLEDs are transferred onto a target substrate (e.g., a substrate of the display panel) through a mass transfer technique. The transfer yield and efficiency of massive transfer is the key to mass production of the µLED display panel. When one µLED die is unsuccessfully transferred, indicating that a connecting status of that µLED die and the target substrate is short circuited or open circuited, a dark spot will appear in the displayed image. Therefore, how to detect the unsuccessfully transferred µLED die in the mass transfer, or/and further compensate the display effect of the corresponding pixel of the unsuccessfully transferred µLED die is an important subject in the field of µLED display panel technology.

It should be noted that, the content in the paragraph "Description of Related Art" are intended to assist understanding the invention. Part of the content (or all content) disclosed in the paragraph "Description of Related Art" may not be the conventional technology known by a person of ordinary skill in the art. The content disclosed in the paragraph "Description of Related Art" may not mean the content is known by a person of ordinary skill in the art before application of the invention.

SUMMARY OF THE INVENTION

The invention provides a driving apparatus that can detect an electric characteristic related to a light-emitting element of a pixel circuit.

An embodiment of the invention provides a driving apparatus for driving a driving panel. The driving apparatus includes a connection pad, a selecting circuit, a data driving circuit and a detection circuit. The connection pad is configured to be electrically connected to a data line of the display panel. The selecting circuit has a first terminal, a second terminal and a third terminal. The third terminal of the selecting circuit is coupled to the connection pad. An output terminal of the data driving circuit is coupled to the first terminal of the selecting circuit. The data driving circuit outputs a data voltage to a pixel circuit of the display panel through the selecting circuit and the connection pad in a display stage. An input terminal of the detection circuit is coupled to the second terminal of the selecting circuit. The detection circuit provides a detection signal to the light-emitting element of the pixel circuit through the selection circuit and the connection pad in a detection stage. The detection circuit detects a resultant signal with respect to an electric characteristic of the light-emitting element of the pixel circuit in the detection stage.

Based on the above, the driving apparatus described in various embodiments of the invention can output the data voltage to the pixel circuit of the display panel through the connection pad in the display stage and provide the detection signal to the light-emitting element of the pixel circuit through the same connection pad in the detection stage. Based on the provided detection signal, the driving apparatus can detect the electric characteristic related to the light-emitting element of the pixel circuit in the detection stage.

To make the above features and advantages of the disclosure more comprehensible, several embodiments accompanied with drawings are described in detail as follows.

DESCRIPTION OF THE PREFERRED EMBODIMENTS

Figure 1:
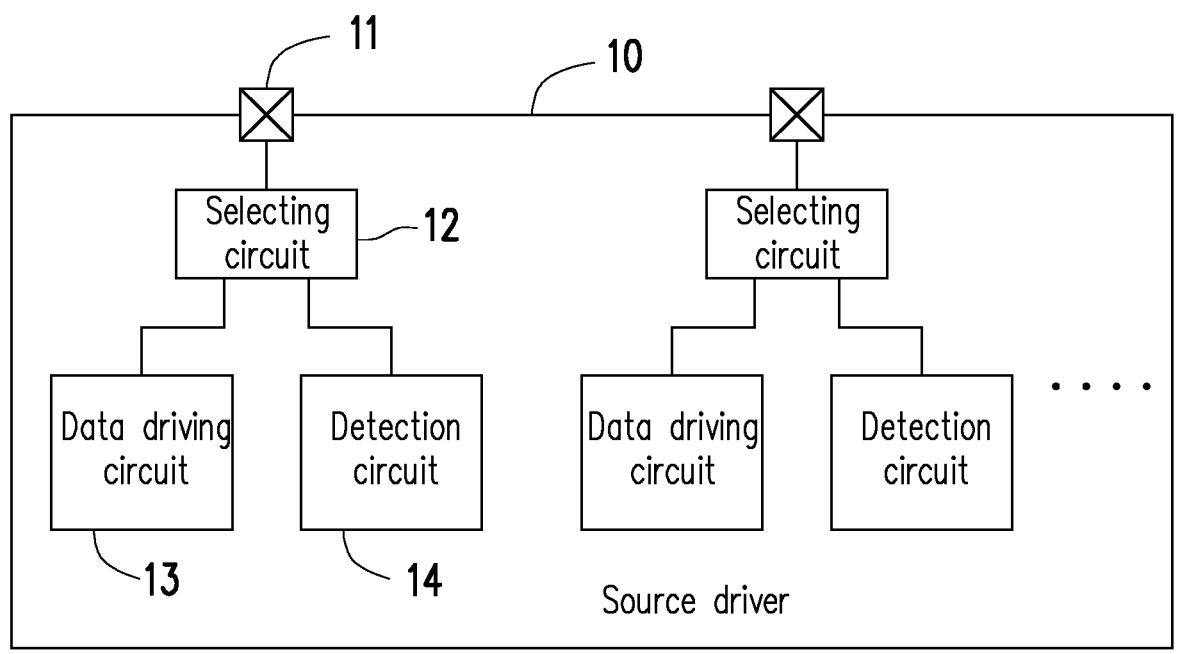
FIG. 1 is a circuit block diagram of a source driver according to an embodiment of the invention.

The term "coupled (or connected)" used in this specification (including claims) may refer to any direct or indirect connection means. For example, "a first device is coupled (connected) to a second device" should be interpreted as "the first device is directly connected to the second device" or "the first device is indirectly connected to the second device through other devices or connection means". The terms such as "first", "second" and the like as recited in full text of the specification (including claims) are intended to give the elements names or distinguish different embodiments or scopes, and are not intended to limit an upper limit or a lower limit of the number of the elements nor limit an order of the elements. Moreover, wherever possible, elements/components/steps with same reference numerals represent same or similar parts in the drawings and embodiments. Elements/components/steps with the same reference numerals or names in different embodiments may be cross-referenced.

FIG. 1 is a circuit block diagram of a source driver (or a data driver) 10 according to an embodiment of the invention. In this embodiment of the invention, the source driver 10 may be used for driving a micro light-emitting diode (μLED) display panel. The source driver 10 includes a connection pad 11, a selecting circuit 12, a data driving circuit 13 and a detection circuit 14. The connection pad 11, the selecting circuit 12, the data driving circuit 13 and the detection circuit 14 may be regarded as one driving channel circuit, and the source driver 10 includes a plurality of the driving channel circuits, as repeatedly illustrated in FIG. 1. The connection pad 11 may be regarded as a connection port of the driving channel circuit configured to electrically connect the source driver 10 to a corresponding data line (not illustrated in FIG. 1) in the display panel. The selecting circuit 12 has a first terminal, a second terminal and a third terminal. The first terminal is coupled to the data driving circuit 13. The second terminal is coupled to the detection circuit 14. The third terminal is coupled to the connection pad 11. The selecting circuit 12 is, for example, a multiplexer with part of all of terminals being bi-directional terminals. An output terminal of the data driving circuit 13 is coupled to the first terminal of the selecting circuit 12. In a display stage, the data driving circuit 13 receives pixel data (e.g., receives the pixel data from a timing control circuit), converts the pixel data into a data voltage, and outputs the data voltage to the display panel through the selecting circuit 12 and the connection pad 11 so as to drive pixel circuits on the display panel to display the corresponding data. The data driving circuit 13 may include an output buffer, a digital to analog converter (DAC0, a level shifter, a line buffer and/or other elements. When the source driver 10 is used for driving the μLED display panel, the data driving circuit 13 may simply be designed only to meet the requirements of the μLED display panel.

An input terminal of the detection circuit 14 is coupled to the second terminal of the selecting circuit 12, and an output terminal of the detection circuit 14 may be coupled to a timing controller (not illustrated in FIG. 1). In a detection stage, the detection circuit 14 provides a detection signal to a light-emitting element (e.g., the μLED) of the pixel circuit of the display panel through the selecting circuit 12 and the connection pad 11, and detects a resultant signal with respect to an electric characteristic of the light-emitting element of the pixel circuit. The electric characteristic of the light-emitting element includes a voltage or a current of the light-emitting element. The resultant signal represents a connecting status of the light-emitting element and the display panel being normal or abnormal (short circuited or open circuited), that is, whether the light-emitting element is transferred successfully or unsuccessfully in the process of mass transfer.

The detection circuit 14 may have different circuit implementations. According to the different circuit implementations, the detection signal may be a voltage signal while the resultant signal is the voltage of the light-emitting element; or the detection signal may be a voltage signal while the resultant signal is the current of the light-emitting element; or the detection signal may be a current signal while the resultant signal is the voltage of the light-emitting element. The different circuit implementations, the detection signal and the resultant signal of the detection circuit 14 would be described in detail below.

Figure 2:
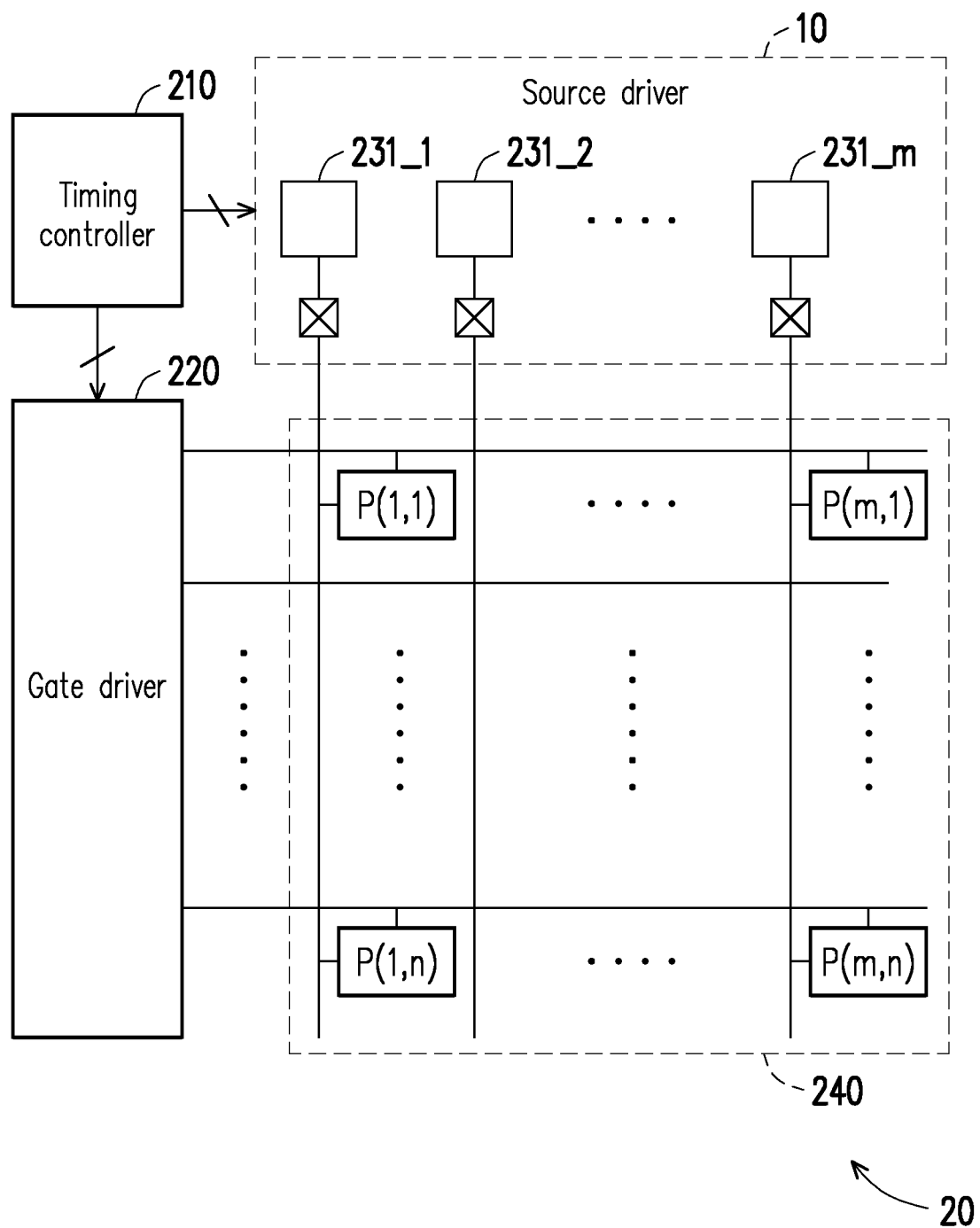
FIG. 2 is a circuit block diagram of a display apparatus according to an embodiment of the invention.

FIG. 2 is a circuit block diagram of a display apparatus 20 according to an embodiment of the invention. The display apparatus 20 of FIG. 2 includes a timing controller 210, a gate driver 220, a source driver 10 and a display panel 240. The display panel 240 may be any type of light-emitting display panel, such as an organic light-emitting diode (OLED) display panel, a micro light-emitting diode (μLED) display panel or other display panels. The display panel 240 includes a plurality of scan lines (or gate lines), a plurality of data lines (or source lines) and a plurality of pixel circuits. For example, the pixel circuits includes m*n pixel circuits P(1,1), ..., P(m,1), ..., P(1,n), ..., and P(m,n), where m and n may be any integer determined according to design requirements.

The gate driver 220 is coupled to the different scan lines of the display panel 240. The gate driver 220 can scan/drive each scan line of the display panel 240. The gate driver 220 may be any type of gate driver. For example, according to design requirements, the gate driver 220 may be a conventional gate driver or other gate drivers.

The source driver 10 includes a plurality of driving channel circuits, such as m driving channel circuits 231_1, 231_2, ..., and 231_m shown in FIG. 2. Output terminals of these driving channel circuits 231_1 to 231_m are coupled to the corresponding data lines in the display panel 240. The driving channel circuits 231_1 to 231_m can convert digital pixel data provided by the timing controller 210 into corresponding analog data voltages (pixel voltages), and write the data voltages into the corresponding pixel circuits of the display panel through the data lines in accordance with a scanning timing of the gate driver 220, so as to display images. Each driving channel circuit among the driving channel circuits 231_1 to 231_m can include the connection pad 11, the selecting circuit 12, the data driving circuit 13 and the detection circuit 14 shown in FIG. 1.

Figure 3:
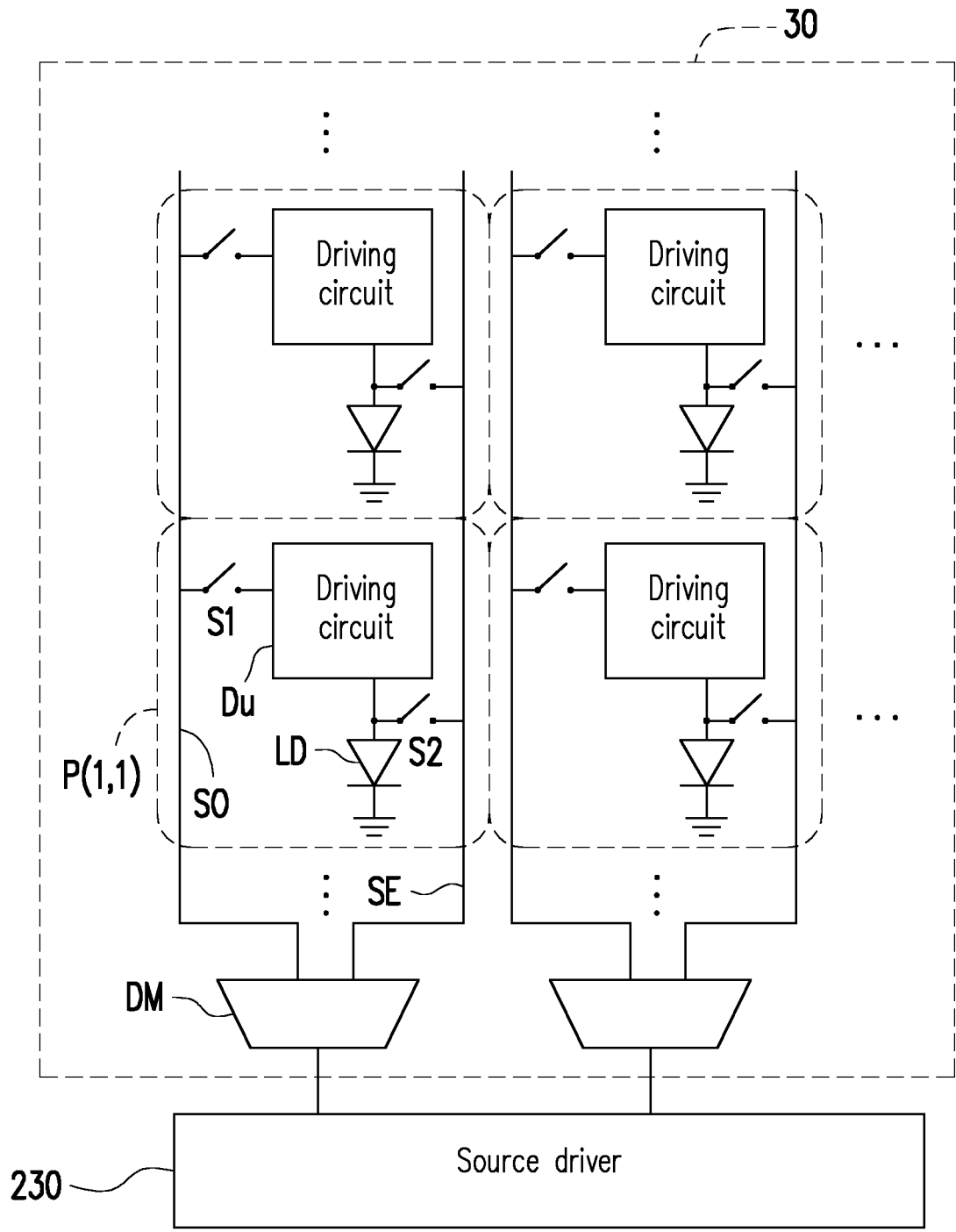
FIG. 3 is a circuit block diagram of a display panel according to an embodiment of the invention.

FIG. 3 is a circuit block diagram of a display panel 30 according to an embodiment of the invention. The display panel 30 may be used in the display apparatus 20 of FIG. 2 as the display panel 240. In the embodiment shown by FIG. 3, the display panel 30 further includes a plurality of demultiplexers DM. The embodiment shown by FIG. 3 is described with the pixel circuit P(1,1) and the demultiplexer DM as an example. Since other pixel circuits of the display panel 30 may refer to the related description of the pixel circuit P (1, 1) while other demultiplexers of the display panel 30 may refer to the related description of the demultiplexer DM, those related descriptions are not repeated hereinafter.

A common terminal of the demultiplexer DM is coupled to one pin (or the connection pad) of the source driver 230 (e.g., the source driver 10 of FIG. 2). A first selecting terminal of the demultiplexer DM is coupled to a data line SO. A second selecting terminal of the demultiplexer DM is coupled to a sense line SE. Based on the control of the timing controller 210, the demultiplexer DM can selectively have the pin (or the connection pad) of the source driver 230 electrically connected to the data line SO in the display stage and the pin (or the connection pad) of the source driver 230 electrically connected to the sense line SE in the detection stage.

The pixel circuit P(1,1) is coupled to the data line SO and the sense line SE. In the embodiment shown by FIG. 3, the pixel circuit P(1,1) includes a switch S1, a switch S2, a light-emitting element LD and a driving circuit DU. A first terminal of the switch S1 is coupled to the data line SO, and a second terminal of the switch S1 is coupled to the driving circuit DU. In the embodiments of the invention, although the switch S1 is shown outside the driving circuit DU, the switch S1 may actually be a switch inside the driving circuit DU, such as a scan transistor inside the driving circuit DU. The scan transistor has a source connected to the data line, a gate connected to the gate line (for receiving a scan signal), and a drain connected to other circuits inside the driving circuit DU. The driving circuit DU is coupled to the light-emitting element LD such as the μLED. A first terminal of the switch S2 is coupled to the sense line SE, and a second terminal of the switch S2 is coupled to the light-emitting element LD. The switch S1 and the switch S2 are controlled by the gate driver 220. Based on the control of the timing controller 210, in the display stage of the pixel circuit P(1,1), the switch S1 is turned on and the switch S2 is turned off. In the detection stage of the pixel circuit P(1,1), the switch S1 is turned off and the switch S2 is turned on.

When the pixel circuit P(1,1) operates in the display stage, since the switch S1 is turned on and the switch S2 is turned off, the data driving circuit (e.g., the data driving circuit 13 of FIG. 1) in the source driver 230 can output the data voltage to the driving circuit DU of the pixel circuit P(1,1) through the demultiplexer DM, the data line SO and the switch S1 so that the driving circuit DU outputs a driving current to the light-emitting element LD. Based on a level of the data voltage, the driving circuit DU can adjust the driving current for the light-emitting element LD, thereby adjusting the brightness of the light-emitting element LD to display corresponding gray scale data. When the pixel circuit P(1,1) operates in the detection stage, since the switch S2 is turned on and the switch S1 is turned off, the detection circuit (e.g., the detection circuit 14 of FIG. 1) in the source driver 230 can provide the detection signal to the light-emitting element of the pixel circuit through the demultiplexer DM, the sense line SE and the switch S2, and detect the resultant signal with respect to the electric characteristic of the light-emitting element LD of the pixel circuit.

Figure 4:
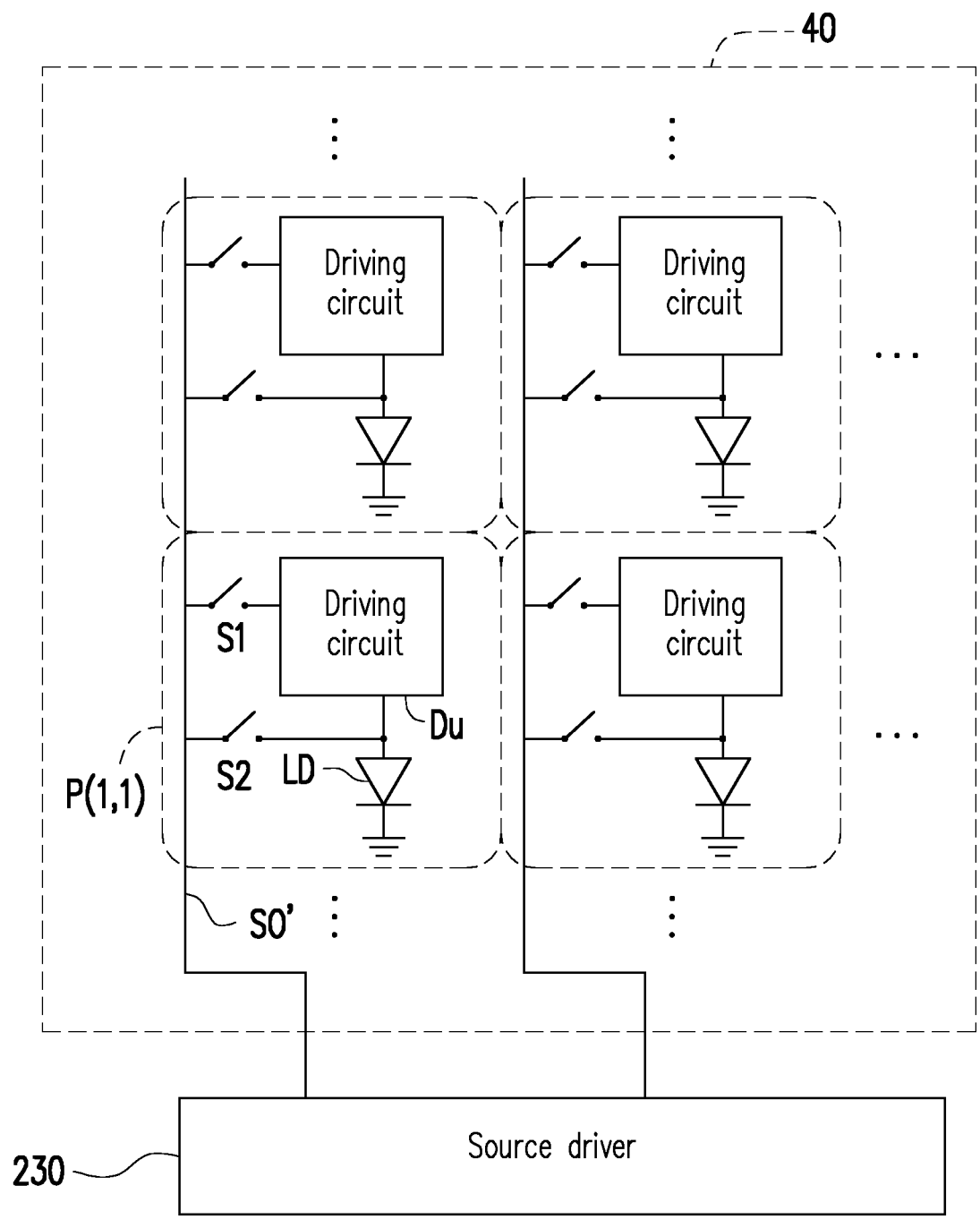
FIG. 4 is a circuit block diagram of a display panel according to another embodiment of the invention.

FIG. 4 is a circuit block diagram of a display panel 40 according to another embodiment of the invention. The display panel 40 may be used in the display apparatus 20 of FIG. 2 as the display panel 240. In FIG. 4, the display panel 40 includes a data line SO' but does not include the sense line SE of FIG. 3. Accordingly, the data display and the detection on the light-emitting element are both performed through the data line SO'. The pixel circuit P(1,1) includes a switch S1, a switch S2, a light-emitting element LD and a driving circuit DU. A first terminal of the switch S1 is coupled to the data line SO'. A second terminal of the switch S1 is coupled to the driving circuit DU. In the embodiments of the invention, although the switch S1 is shown outside the driving circuit DU, the switch S1 may actually be a switch inside the driving circuit DU, such as a scan transistor inside the driving circuit DU. The driving circuit DU is coupled to the light-emitting element LD. A first terminal of the switch S2 is coupled to the data line SO', and a second terminal of the switch S2 is coupled to the light-emitting element LD. The switch S1 and the switch S2 are controlled by the gate driver 220. Based on the control of the timing controller 210, when the pixel circuit P(1,1) operates in the display stage, the switch S1 is turned on and the switch S2 is turned off.

When the pixel circuit P(1,1) operates in the detection stage, the switch S1 is turned off and the switch S2 is turned on. Actions performed on the display panel 40 by the source driver 230 shown by FIG. 4 in the display stage and the detection stage are the same to the content described for FIG. 3, which is not repeated hereinafter.

Figure 5:
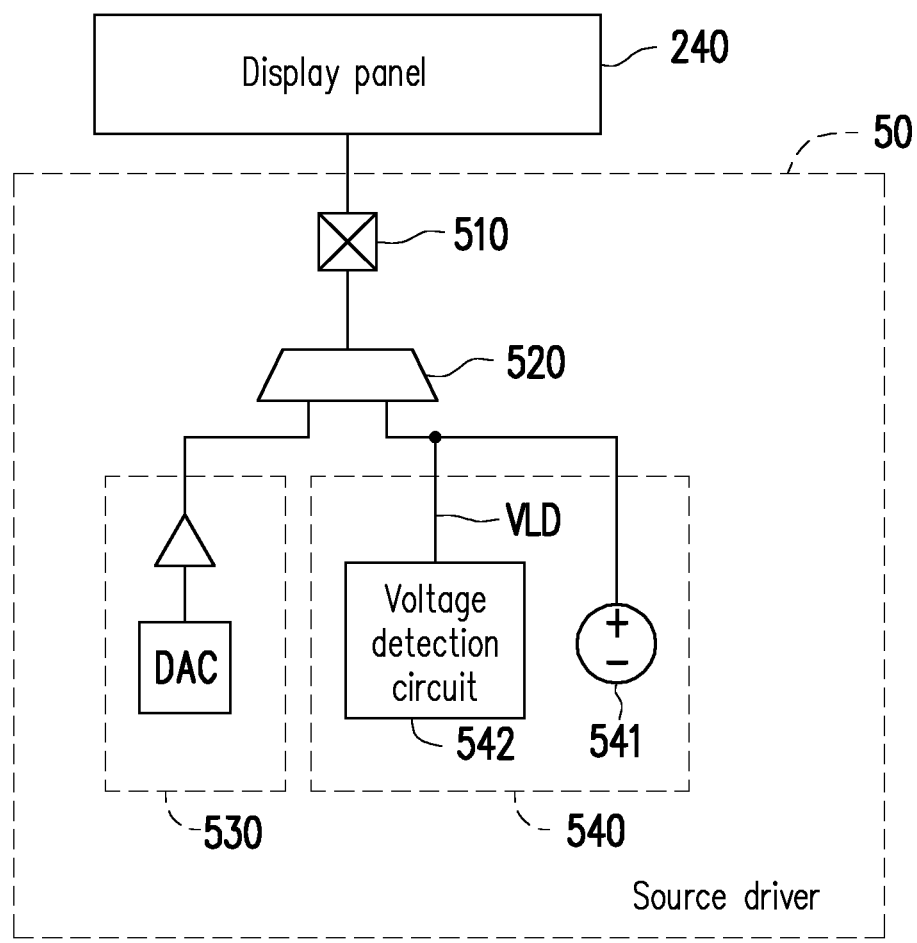
FIG. 5 is a circuit block diagram of a source driver according to an embodiment of the invention.
Figure 6:
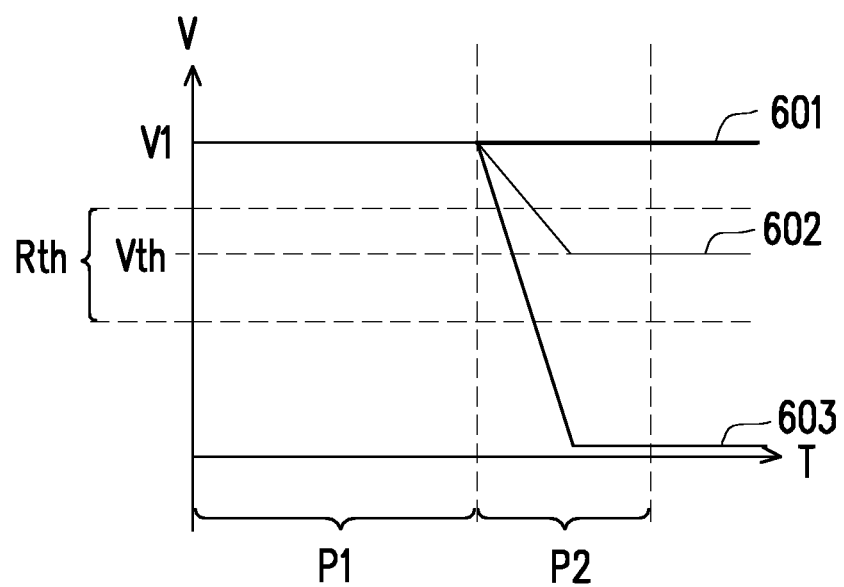
FIG. 6 illustrates a characteristic curve graph corresponding to a connecting status of a light-emitting element and a display panel detected by the source driver in FIG. 5.
Figure 8:
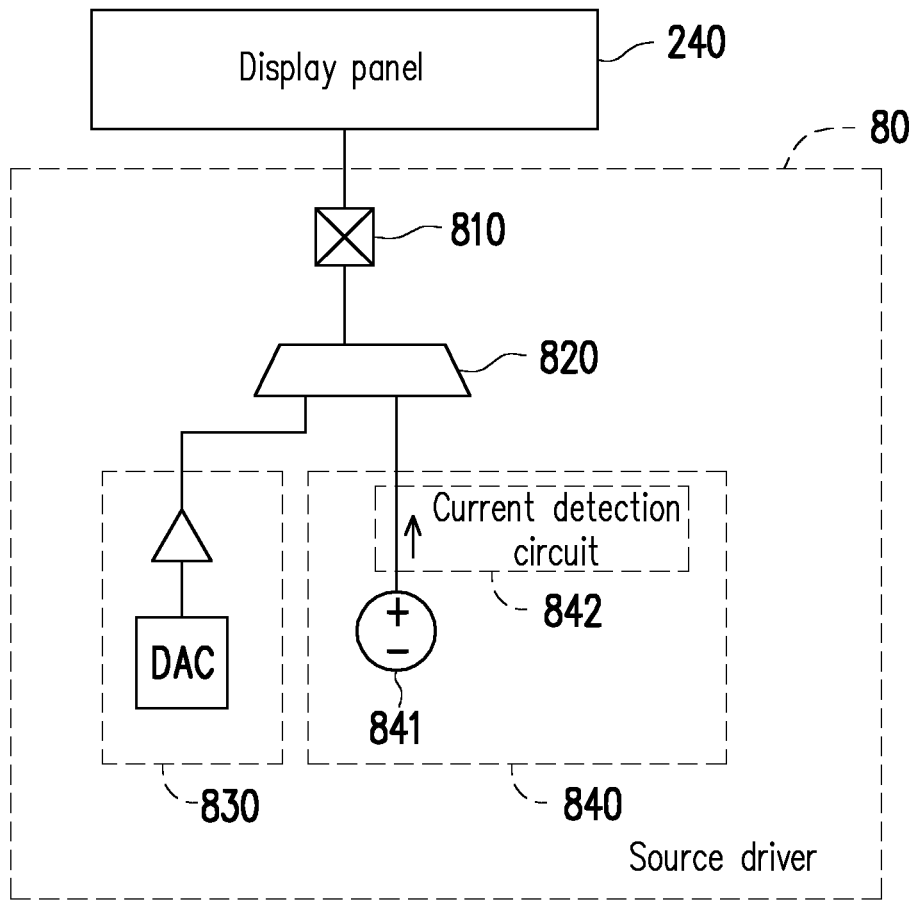
FIG. 8 is a circuit block diagram of a source driver according to an embodiment of the invention.
Figure 9:
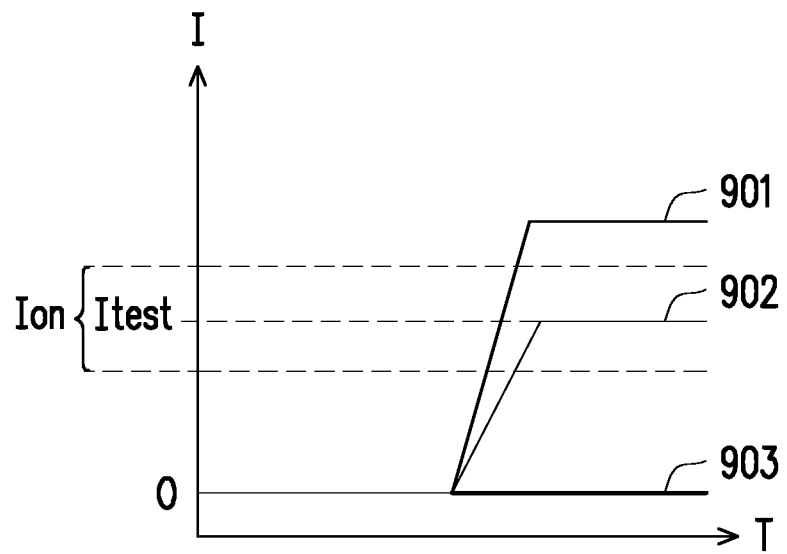
FIG. 9 illustrates a characteristic curve graph corresponding to a connecting status of a light-emitting element and a display panel detected by the source driver in FIG. 8.
Figure 10:
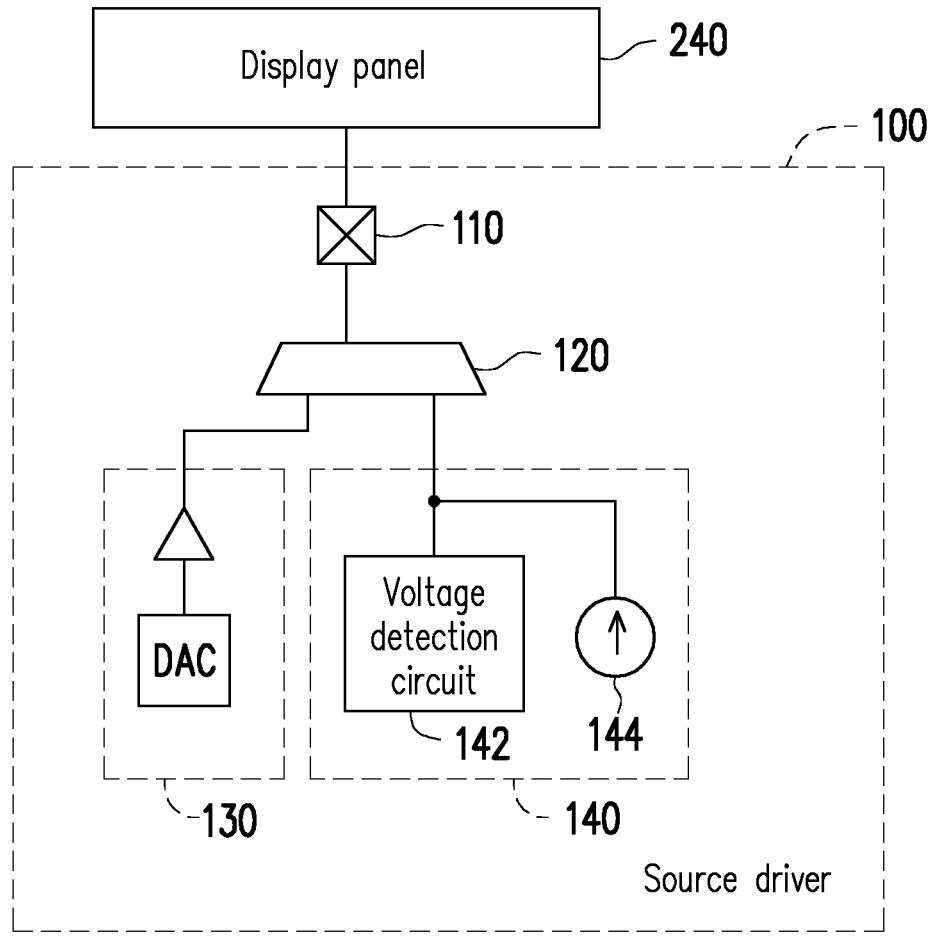
FIG. 10 is a circuit block diagram of a source driver according to an embodiment of the invention.
Figure 11:
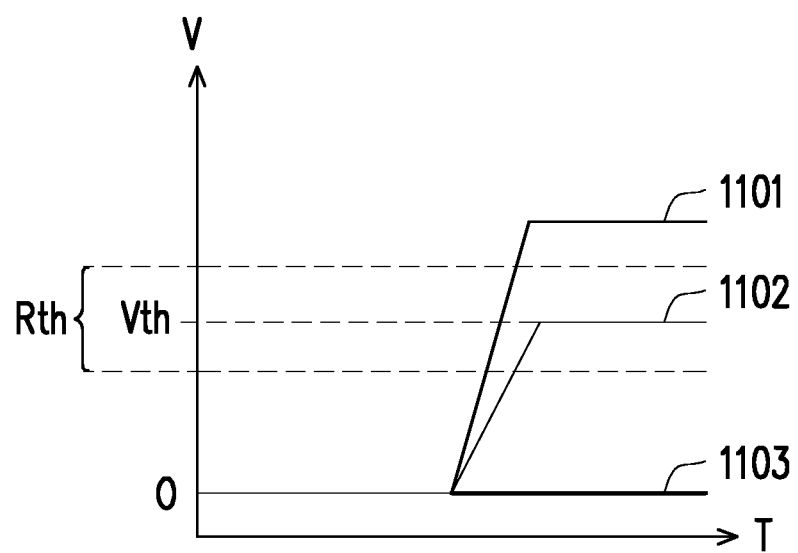
FIG. 11 illustrates a characteristic curve graph corresponding to a connecting status of a light-emitting element and a display panel detected by the source driver in FIG. 8.

FIG. 5, FIG. 8 and FIG. 10 are circuit block diagrams of source drivers 50, 80 and 100 in the embodiments of the invention, in which the detection circuits in the three source drivers are different. FIG. 6, FIG. 9 and FIG. 11 respectively illustrate characteristic curve graphs corresponding to the connecting status of the light-emitting element and the display panel detected by the source drivers in FIG. 5, FIG. 8 and FIG. 10. FIG. 5 is a circuit block diagram of a source driver 50 according to an embodiment of the invention. The source driver 50 includes a connection pad 510, a selecting circuit 520, a data driving circuit 530 and a detection circuit 540. The connection pad 510, the selecting circuit 520, the data driving circuit 530 and the detection circuit 540 may be regarded as one driving channel circuit, and the source driver 50 includes a plurality of the driving channel circuits, which are not repeatedly illustrated in FIG. 5. Connection relationship between the terminals of the above circuits and the operations of the display stage and the detection stage may refer to the related description of the source driver 10 of FIG. 1, which are not repeated hereinafter. Therefore, only the detection circuit 540 is described below.

The detection circuit 540 includes a voltage source 541 and a voltage detection circuit 542, both of which are coupled to a second terminal of the selecting circuit 520. The voltage source 541 is configured to generate a detection signal and provide the detection signal to the light-emitting element of the pixel circuit through the selecting circuit 520 and the connection pad 510. The voltage detection circuit 542 detects the resultant signal with respect to the electric characteristic of the light-emitting element of the pixel circuit through the selecting circuit 520 and the connection pad 510.

The following description refers to FIG. 5 and FIG. 6 together. FIG. 6 is illustrates a characteristic curve graph corresponding to a connecting status of a light-emitting element and a display panel detected by the source driver 50 in FIG. 5. As illustrated in FIG. 6, a horizontal axis represents a time T and a vertical axis represents a voltage V of the light-emitting element LD. In a first period P1 of the detection stage, the voltage source 541 provides the detection signal to the light-emitting element LD. In this embodiment, the detection signal is the voltage signal, and its voltage level (e.g., a voltage V1) needs to be enough to turn on the light-emitting element LD (e.g., by setting the voltage level to be greater than an upper boundary of a threshold voltage range Rth of the light-emitting element LD). In a second period P2 after the first period P1, the voltage source 541 stops providing the detection signal, or may further set the connection pad 510 to a high impedance state (Hi-Z). After the second period P2, the voltage detection circuit 542 may detect the voltage of the light-emitting element LD as the resultant signal.

Under the circumstance where the connecting status of the light-emitting element LD is normal, in the second period P2, a parasitic capacitance between the light-emitting element LD and the display panel is discharged from a path of the light-emitting element LD, i.e., the voltage of the light-emitting element LD drops. After the second period P2, a voltage of the parasitic capacitance is stabilizing, and the voltage of the light-emitting element LD drops to fall within the threshold voltage range Rth, as shown by a characteristic curve 602 in FIG. 6. Therefore, after the second period P2, based on the resultant signal (the voltage of the light-emitting element LD) being within the threshold voltage range, it can be determined that the connecting status of the light-emitting element LD is normal.

Under the circumstance where the connecting status of the light-emitting element LD and the display panel is short circuited, in the second period P2, the parasitic capacitance between the light-emitting element LD and the display panel is discharged to the ground from the path of the light-emitting element LD. That is to say, the voltage of the light-emitting element LD is pulled down to a ground level, as shown by a characteristic curve 603 in FIG. 6. Therefore, after the second period P2, based on the resultant signal (the voltage of the light-emitting element LD) being lower than a lower boundary of the threshold voltage range Rth or being the ground level, it can be determined that the connecting status of the light-emitting element LD is short circuited.

Under the circumstance where the connecting status of the light-emitting element LD and the display panel is open circuited, in the second period P2, the parasitic capacitance between the light-emitting element LD and the display panel is not discharged. That is to say, the voltage of the light-emitting element LD is not be pulled down, as shown by a characteristic curve 601 in FIG. 6. Therefore, after the second period P2, based on the resultant signal (the voltage of the light-emitting element LD) being higher than the upper boundary of the threshold voltage range Rth, it can be determined that the connecting status of the light-emitting element LD is open circuited.

Figure 7:
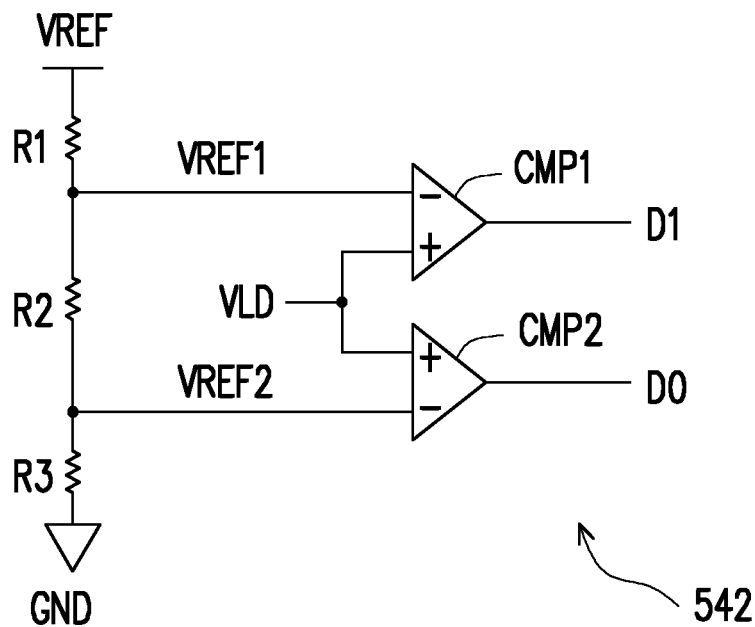
FIG. 7 is a circuit block diagram of a voltage detection circuit according to an embodiment of the invention.

FIG. 7 is a circuit block diagram of the voltage detection circuit 542 according to an embodiment of the invention. In FIG. 7, a resistor R1, a resistor R2 and a resistor R3 are connected to each other in series between a reference voltage VREF and a ground voltage GND. Accordingly, the resistors R1 to R3 may divide the reference voltage VREF to generate a reference voltage VREF1 and a reference voltage VREF2. Resistances of the resistor R1, the resistor R2 and the resistor R3 may be set according to design requirements. Based on a proportion of the resistances of the resistor R1, the resistor R2, and the resistor R3, the reference voltage VREF1 and the reference voltage VREF2 may be arbitrarily set. For instance, the reference voltage VREF1 and the reference voltage VREF2 may be boundary values of the threshold voltage range Rth of the light-emitting element LD.

The voltage detection circuit 542 may include a voltage comparator CMP1 and a voltage comparator CMP2. An inverting input terminal of the voltage comparator CMP1 is configured to receive the reference voltage VREF1. A non-inverting input terminal of the voltage comparator CMP1 is coupled to the second terminal of the selecting circuit 520 to receive a resultant signal, that is, a voltage VLD of the light-emitting element LD. The voltage comparator CMP1 compares the reference voltage VREF1 and the voltage VLD of the light-emitting element LD and outputs a comparison result D1. An inverting input terminal of the voltage comparator CMP2 is configured to receive the reference voltage VREF2. A non-inverting input terminal of the voltage comparator CMP2 is coupled to the second terminal of the selecting circuit 520 to receive the voltage VLD of the light-emitting element LD. The voltage comparator CMP2 compares the reference voltage VREF2 and the voltage VLD of the light-emitting element LD and outputs a comparison result D0. A digital circuit (not illustrated) of the voltage detection circuit 542 can determine that the connecting status of the light-emitting element LD is normal, short circuited, or open circuited according to the comparison result D1 and the comparison result D0. For instance, when the comparison result D1 and the comparison result D0 are both logic "1", the voltage detection circuit 542 can determine that the connecting status of the light-emitting element LD and the display panel is open circuited. When the comparison result D1 is logic "0" and the comparison result D0 is logic "1", the voltage detection circuit 542 can determine that the connecting status of the light-emitting element LD and the display panel is normal. When the comparison result D1 and the comparison result D0 are both logic "0", the voltage detection circuit 542 can determine that the connecting status of the light-emitting element LD and the display panel is short circuited.

FIG. 8 is a circuit block diagram of a source driver 80 according to an embodiment of the invention. The source driver 80 includes a connection pad 810, a selecting circuit 820, a data driving circuit 30 and a detection circuit 840. The connection pad 810, the selecting circuit 820, the data driving circuit 830 and the detection circuit 840 may be regarded as one driving channel circuit. Connection relationship between the terminals of the above circuits and the operations of the display stage and the detection stage may refer to the related description of the source driver 10 of FIG. 1, which are not repeated hereinafter. Therefore, only the detection circuit 840 is described below.

The detection circuit 840 includes a voltage source 841 and a current detection circuit 842. The voltage source 841 is coupled to a second terminal of the selecting circuit 820. The voltage source 841 is configured to generate a detection signal and provide the detection signal to the light-emitting element of the pixel circuit through the selecting circuit 820 and the connection pad 810. In this embodiment, the detection signal is the voltage signal, and its voltage level needs to be enough to turn on the light-emitting element LD (e.g., by setting the voltage level to be greater than an upper boundary of a threshold voltage range Rth of the light-emitting element LD). The current detection circuit 842 may be coupled between the voltage source 841 and the second terminal of the selecting circuit 820. The current detection circuit 842 detects a current flowing through a path between the voltage source 841 and the second terminal of the selecting circuit 820, where the detected current is the resultant signal and is associated with a current of the light-emitting element LD. Further, the current detection circuit 842 can determine that the connecting status of the light-emitting element and the display panel is normal, short circuited or open circuited by comparing the resultant signal (the current signal) and a turn-on current range Ion of the light-emitting element LD.

The following description refers to FIG. 8 and FIG. 9 together. FIG. 9 is illustrates a characteristic curve graph corresponding to a connecting status of a light-emitting element and a display panel detected by the source driver 80 in FIG. 8. As illustrated in FIG. 9, a horizontal axis represents a time T and a vertical axis represents a current I of the light-emitting element LD.

Under the circumstance where the connecting status of the light-emitting element LD is normal, the current flowing through the light-emitting element LD is a current Itest corresponding to the detection signal (the voltage signal), and the current Itest may be known from the I-V characteristic curve of the light-emitting element LD. As shown by a characteristic curve 902 shown by FIG. 9, after providing the detection signal to the light-emitting element LD, the voltage source 841 can determine that the connecting status of the light-emitting element LD is normal according to the resultant signal (the current Itest of the light-emitting element LD) being within the turn-on current range.

Under the circumstance where the connecting status of the light-emitting element LD and the display panel is open circuited, there is no current flowing through the light-emitting element LD, as shown by a characteristic curve 903 in FIG. 9. Accordingly, after providing the detection signal to the light-emitting element LD, the voltage source 841 can determine that the connecting status of the light-emitting element LD is open circuited according to the resultant signal (the current Itest of the light-emitting element LD) being equal to zero current.

Under the circumstance where the connecting status of the light-emitting element LD and the display panel is short circuited, the detection signal provided to the light-emitting element LD by the voltage source 841 is directly connected to the ground. That is to say, a strong current passes through the light-emitting element LD, as shown by a characteristic curve 901 in FIG. 9. Accordingly, after providing the detection signal to the light-emitting element LD, the voltage source 841 can determine that the connecting status of the light-emitting element LD is short circuited according to the resultant signal being the strong current (e.g., which is far higher than an upper boundary of the turn-on current range Ion).

FIG. 10 is a circuit block diagram of a source driver 100 according to an embodiment of the invention. The source driver 100 includes a connection pad 110, a selecting circuit 120, a data driving circuit 130 and a detection circuit 140. The connection pad 10, the selecting circuit 120, the data driving circuit 130 and the detection circuit 140 may be regarded as one driving channel circuit, and the source driver 110 includes a plurality of the driving channel circuits, which are not repeatedly illustrated in FIG. 10. Connection relationship between the terminals of the above circuits and the operations of the display stage and the detection stage may refer to the related description of the source driver 10 of FIG. 1, which are not repeated hereinafter. Therefore, only the detection circuit 140 is described below.

The detection circuit 140 includes a current source 141 and a voltage detection circuit 142, which are coupled to a second terminal of the selecting circuit 120. The current source 141 is configured to generate a detection signal and provide the detection signal to the light-emitting element of the pixel circuit through the selecting circuit 120 and the connection pad 110. In this embodiment, the detection signal is the current signal. The voltage detection circuit 142 detects the resultant signal with respect to the electric characteristic of the light-emitting element of the pixel circuit through the selecting circuit 120 and the connection pad 110, where the resultant signal is the voltage signal.

The following description refers to FIG. 10 and FIG. 11 together. FIG. 11 is illustrates a characteristic curve graph corresponding to a connecting status of a light-emitting element and a display panel detected by the source driver 100 in FIG. 10. As illustrated in FIG. 11, a horizontal axis represents a time T and a vertical axis represents a voltage V of the light-emitting element LD.

Under the circumstance where the connecting status of the light-emitting element LD and the display panel is normal, the voltage of the light-emitting element LD (e.g., a threshold voltage Vth) detected by the voltage detection circuit 142 is within the threshold voltage range Rth, as shown by a characteristic curve 1102 in FIG. 10. Accordingly, after providing the detection signal (the current signal) to the light-emitting element LD, the current source 141 can determine that the connecting status of the light-emitting element LD is normal according to the resultant signal (the voltage of the light-emitting element LD) being within the threshold voltage range Rth.

Under the circumstance where the connecting status of the light-emitting element LD and the display panel is short circuited, the detection signal provided to the light-emitting element LD by the current source 141 is directly connected to the ground. That is to say, the voltage of the light-emitting element LD is pulled down to the ground level, as shown by a characteristic curve 1103 in FIG. 11. Accordingly, after providing the detection signal to the light-emitting element LD, the voltage source 141 can determine that the connecting status of the light-emitting element LD is short circuited according to the resultant signal being a signal with potential equal to the ground level.

Under the circumstance where the connecting status of the light-emitting element LD and the display panel is open circuited, there is not current flowing through the light-emitting element LD. That is to say, the voltage of the light-emitting element LD is not pulled down but maintained at a high potential (this potential may be determined with reference to the I-V characteristic curve of the light-emitting element) corresponding to the detection signal (the current signal), which is, for example, higher than the upper boundary of the threshold voltage range of the light-emitting element LD, as shown by a characteristic curve 1101 in FIG. 11. Accordingly, after providing the detection signal to the light-emitting element LD, the current source 141 can determine that the connecting status of the light-emitting element LD is open circuit according to the resultant signal (the voltage of the light-emitting element LD) being higher than the upper boundary of the threshold range Rth.

In addition, actions of the source driver 230 before the detection state starts is described below with the display panel 30 of FIG. 3 as an example. Before the detection stage starts, the source driver 230 can output a control voltage to the driving circuit DU of the pixel circuit P(1,1) through the demultiplexer DM, the data line SO and the switch S1 so an output of the driving circuit DU is in the high impedance state (Hi-Z, i.e., the driving current is not output to the light-emitting element LD). After the output of the driving circuit DU is set to the high impedance state, the switch S1 is turned off. Accordingly, in the detection stage (with the output of the driving circuit DU in the high impedance state), the source driver 230 can provide the detection signal to the light-emitting element LD of the pixel circuit P(1,1) through the demultiplexer DM, the sense line SE and the switch S2, and detect the resultant result with respect to the electric characteristic of the light-emitting element LD of the pixel circuit P(1,1) through the demultiplexer DM, the sense line SE and the switch S2.

Because FIG. 5, FIG. 8 and FIG. 10 are mainly used to describe the source driver, the source drivers 50, 80 and 100 are simply described as being able to be coupled to the display panel 240 of FIG. 2. The architecture of the display panel 240 may be exemplified by the display panels of FIG. 3 and FIG. 4. Although the light-emitting element LD is not illustrated in FIG. 5, FIG. 8 and FIG. 10, as can be known from the relationship between the display panel and the source driver in FIG. 2 to FIG. 4, the detection circuit in each of the source drivers 50, 80 and 100 can provide the detection signal to the light-emitting element LD of the pixel circuit of the display panel in the detection stage and can also detect the resultant signal with respect to the electric characteristic of the light-emitting element of the pixel circuit so as to determine the connecting status of the light-emitting element LD and the display panel. In terms of the μLED display panel, whether any μLED die is unsuccessfully transferred in the process of mass transfer and thus becomes open circuited or shorted circuit such that the corresponding pixel becomes the dark spot may be determined.

Furthermore, after knowing the positions and/or the number of the unsuccessfully transferred μLED dies of the display panel, a frontend signal processing circuit of the source driver like the timing controller or other processors may further utilize an algorithm like a subpixel rendering algorithm to compensate the display function of the pixel with the unsuccessfully transferred μLED die so the dark spots cannot be easily observed, thereby improving the display quality.

In summary, the driving apparatus(e.g., the source driver 130) described in various embodiments of the invention can output the data voltage to the pixel circuit of the display panel 140 through the connection pad 810 in the display stage and provide the detection signal to the light-emitting element LD of the pixel circuit through the same connection pad 810 in the detection stage. Based on the provided detection signal, the driving apparatus can detect the electric characteristic related to the light-emitting element LD of the pixel circuit in the detection stage. Based on the electric characteristic of the light-emitting element LD, the driving apparatus can determine that the connecting status of the light-emitting element LD is normal, short circuited or open circuited.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A driving apparatus for driving a display panel, the driving apparatus comprising:
    a connection pad, configured to be electrically connected to a data line of the display panel;
    a selecting circuit, having a first terminal, a second terminal, and a third terminal, wherein the third terminal of the selecting circuit is coupled to the connection pad;
    a data driving circuit, having an output terminal coupled to the first terminal of the selecting circuit, wherein the data driving circuit outputs a data voltage to a pixel circuit of the display panel through the selecting circuit and the connection pad in a display stage; and
    a detection circuit, having an input terminal coupled to the second terminal of the selecting circuit, wherein the detection circuit provides a detection signal to a light-emitting element of the pixel circuit through the selecting circuit and the connection pad in a detection stage, and the detection circuit detects a resultant signal with respect to an electric characteristic of the light-emitting element of the pixel circuit in the detection stage,
    wherein the detection circuit comprises:
    a voltage source, coupled to the second terminal of the selecting circuit, wherein the voltage source provides the detection signal to the light-emitting element through the selecting circuit and the connection pad for a first period and stops providing the detection electricity for a second period; and
    a voltage detection circuit, coupled to the second terminal of the selecting circuit, wherein the voltage detection circuit detects a voltage of the light-emitting element as the resultant signal through the selecting circuit and the connection pad after the second period, and determines that a connecting status of the light-emitting element is normal, short circuited, or open circuited.

2. The driving apparatus according to claim 1, wherein a voltage level of the detection signal is greater than a threshold voltage range of the light-emitting element, the detection circuit provides the detection signal to the light-emitting element in the first period, the detection circuit stops providing the detection signal in the second period after the first period, and the detection circuit detects the voltage of the light-emitting element as the resultant signal through the selecting circuit and the connection pad after the second period.

3. The driving apparatus according to claim 1, wherein the voltage detection circuit determines the connecting status of the light-emitting element by comparing the voltage of the light-emitting element and a threshold voltage range of the light-emitting element.

4. The driving apparatus according to claim 1, wherein the voltage detection circuit comprises an analog to digital converter.

5. The driving apparatus according to claim 1, wherein the voltage detection circuit comprises
    a first voltage comparator, having an inverting input terminal for receiving a first reference voltage, wherein a non-inverting input terminal of the first voltage comparator is coupled to the second terminal of the selecting circuit, and the first voltage comparator compares the first reference voltage and the voltage of the light-emitting element to output a first comparison result; and
    a second voltage comparator, having an inverting input terminal for receiving a second reference voltage, wherein a non-inverting input terminal of the second voltage comparator is coupled to the second terminal of the selecting circuit, and the second voltage comparator compares the second reference voltage and the voltage of the light-emitting element to output a second comparison result.

6. The driving apparatus according to claim 5, wherein the voltage detection circuit determines that the connecting status of the light-emitting element is normal, short circuited, or open circuited according to the first comparison result and the second comparison result.

7. The driving apparatus according to claim 5, wherein the first reference voltage and the second reference voltage are boundary values of a threshold voltage range of the light-emitting element.

8. A driving apparatus for driving a display panel, the driving apparatus comprising:
    a connection pad, configured to be electrically connected to a data line of the display panel;
    a selecting circuit, having a first terminal, a second terminal, and a third terminal, wherein the third terminal of the selecting circuit is coupled to the connection pad;
    a data driving circuit, having an output terminal coupled to the first terminal of the selecting circuit, wherein the data driving circuit outputs a data voltage to a pixel circuit of the display panel through the selecting circuit and the connection pad in a display stage; and
    a detection circuit, having an input terminal coupled to the second terminal of the selecting circuit, wherein the detection circuit provides a detection signal to a light-emitting element of the pixel circuit through the selecting circuit and the connection pad in a detection stage, and the detection circuit detects a resultant signal with respect to an electric characteristic of the light-emitting element of the pixel circuit in the detection stage, wherein the detection circuit comprises:

a voltage source, coupled to the second terminal of the selecting circuit, wherein the voltage source provides the detection signal to the light-emitting element through the selecting circuit and the connection pad in the detection stage; and a current detection circuit, detecting a current flowing through an electric path between the voltage source and the second terminal of the selecting circuit in the detection stage, wherein the current is used as the resultant signal and associated with a current of the light-emitting element.

9. The driving apparatus according to claim 8, wherein a voltage level of the detection signal is greater than a threshold voltage range of the light-emitting element.

10. The driving apparatus according to claim 8, wherein the current detection circuit determines the connecting status of the light-emitting element by comparing the current of the light-emitting element and a turn-on current range of the light-emitting element.

11. A driving apparatus for driving a display panel, the driving apparatus comprising:

a connection pad, configured to be electrically connected to a data line of the display panel;

a selecting circuit, having a first terminal, a second terminal, and a third terminal, wherein the third terminal of the selecting circuit is coupled to the connection pad;

a data driving circuit, having an output terminal coupled to the first terminal of the selecting circuit, wherein the data driving circuit outputs a data voltage to a pixel circuit of the display panel through the selecting circuit and the connection pad in a display stage; and a detection circuit, having an input terminal coupled to the second terminal of the selecting circuit, wherein the detection circuit provides a detection signal to a light-emitting element of the pixel circuit through the selecting circuit and the connection pad in a detection stage, and the detection circuit detects a resultant signal with respect to an electric characteristic of the light-emitting element of the pixel circuit in the detection stage, wherein the detection circuit comprises:

a current source, coupled to the second terminal of the selecting circuit, wherein the current source provides the detection signal to the light-emitting element through the selecting circuit and the connection pad in the detection stage; and a voltage detection circuit, coupled to the second terminal of the selecting circuit, wherein the voltage detection circuit detects a voltage of the light-emitting element as the resultant signal through the selecting circuit and the connection pad in the detection stage, and determines that a connecting status of the light-emitting element is normal, short circuited, or open circuited.

12. The driving apparatus according to claim 11, wherein the detection circuit provides a detection current of the detection signal to the light-emitting element in the detection stage, and the detection circuit detects the voltage of the light-emitting element through the selecting circuit and the connection pad in the detection stage.

13. The driving apparatus according to claim 11, wherein the voltage detection circuit determines the connecting status of the light-emitting element by comparing the voltage of the light-emitting element and a threshold voltage range of the light-emitting element.

14. The driving apparatus according to claim 11, wherein the voltage detection circuit comprises a first voltage comparator, having an inverting input terminal for receiving a first reference voltage, wherein a non-inverting input terminal of the first voltage comparator is coupled to the second terminal of the selecting circuit, and the first voltage comparator compares the first reference voltage and the voltage of the light-emitting element to output a first comparison result; and a second voltage comparator, having an inverting input terminal for receiving a second reference voltage, wherein a non-inverting input terminal of the second voltage comparator is coupled to the second terminal of the selecting circuit, and the second voltage comparator compares the second reference voltage and the voltage of the light-emitting element to output a second comparison result.

15. The driving apparatus according to claim 14, wherein the voltage detection circuit determines that the connecting status of the light-emitting element is normal, short circuited, or open circuited according to the first comparison result and the second comparison result.

16. The driving apparatus according to claim 14, wherein the first reference voltage and the second reference voltage are boundary values of a threshold voltage range of the light-emitting element.

\* \* \* \* \*